United States Patent
Ock et al.

(10) Patent No.: US 10,185,337 B1
(45) Date of Patent: Jan. 22, 2019

(54) LOW-POWER TEMPERATURE-INSENSITIVE CURRENT BIAS CIRCUIT

(71) Applicant: QUALCOMM Incorporated, San Diego, CA (US)

(72) Inventors: Sungmin Ock, San Diego, CA (US); Wenjing Yin, San Diego, CA (US); Xuhao Huang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/945,568

(22) Filed: Apr. 4, 2018

(51) Int. Cl.
*G05F 1/46* (2006.01)
*H03K 17/687* (2006.01)

(52) U.S. Cl.
CPC ............. *G05F 1/46* (2013.01); *H03K 17/687* (2013.01)

(58) Field of Classification Search
CPC ................................ G05F 1/46; H03K 17/687
USPC .......................................... 327/530, 538–543
See application file for complete search history.

(56) References Cited

U.S. PATENT DOCUMENTS

| 6,448,844 B1* | 9/2002 | Cho ........................ G05F 3/242 327/538 |
| 7,755,419 B2 | 7/2010 | Rao et al. |
| 7,994,848 B2 | 8/2011 | Kothandaraman et al. |
| 8,598,862 B2 | 12/2013 | Nikolov et al. |
| 9,438,205 B2 | 9/2016 | Kim et al. |
| 2008/0238530 A1* | 10/2008 | Ito .......................... G11C 16/30 327/513 |
| 2012/0119819 A1 | 5/2012 | Pyo et al. |
| 2012/0293238 A1* | 11/2012 | Chen ........................ G01K 3/10 327/512 |
| 2014/0035553 A1* | 2/2014 | Huang ................... G05F 3/245 323/313 |

* cited by examiner

*Primary Examiner* — Thomas Skibinski
(74) *Attorney, Agent, or Firm* — Haynes and Boone, LLP

(57) ABSTRACT

A bias current circuit is provided with a bias circuit that generates a bias voltage to control the resistance of an active resistor transistor. The bias circuit is configured to generate the bias voltage to be greater than one-half of a power supply voltage for the current bias circuit and to have a negative temperature dependency to reduce the temperature sensitivity of the bias current circuit.

16 Claims, 4 Drawing Sheets

LOW-POWER TEMPERATURE-INSENSITIVE CURRENT BIAS CIRCUIT

TECHNICAL FIELD

This application relates to a current bias circuit, and more particularly to temperature-insensitive current bias circuit with improved stability and density.

BACKGROUND

A current bias source providing a temperature-insensitive output current has many uses. For example, a current bias source may be used to charge a capacitor in a pulse generator. The pulse width from such a pulse generator is highly dependent on the accuracy and stability of the output current from the current bias source. To provide a temperature-insensitive current bias source, it is conventional to use either a bandgap circuit or a beta (β) multiplier circuit to control the current through a resistor. But low power operation of the current bias source is desirable, particularly in battery-operated applications such as smartphones and tablets. In a bandgap-based current bias source, a bandgap voltage of 1.2 V requires relatively large resistances such as 1.2 MΩ to keep the current through the resistor lower than 1 µA. Such a large resistance leads to correspondingly large area demands for the resistor implementation on a semiconductor die. It is thus conventional in low-power applications to implement a bias current source using a beta multiplier having an active resistor implemented by controlling the gate voltage on a metal-oxide semiconductor field-effect transistor (MOSFET).

An example current bias circuit 100 having a β multiplier architecture with an active resistor formed by an n-type MOSFET (NMOS) active resistor transistor MN3 is shown in FIG. 1. The source for active resistor transistor MN3 is connected to ground whereas its drain is connected to the source of an NMOS transistor MN2 that forms a current mirror with a diode-connected NMOS transistor MN1. Depending upon the gate voltage for active resistor transistor MN3, it will pass a corresponding amount of current that is also conducted by transistor MN1 and mirrored through diode-connected transistor MN1. The drain of diode-connected transistor MN1 connects to the drain of a p-type MOSFET (PMOS) transistor MP1 having its source tied to a power supply node for a power supply voltage VDD. Similarly, the drain of transistor MN2 connects to a drain of a PMOS transistor MP2 having its source tied to the power supply node.

An operational amplifier 105 controls the gate voltages for transistors MP1 and MP2 responsive to a comparison of the drain voltages for transistors MN1 and MN2. Operational amplifier 105 also controls the gate voltages for a PMOS transistor MP3 and a PMOS transistor MP4, which both have their sources tied to the power supply node. The drain of transistor MP3 connects to the drain of a diode-connected transistor MN4 having its gate tied to the gate of active resistor transistor MN3 and its source tied to ground. Feedback through operational amplifier 105 will thus control the resistance of active resistor transistor MN3. Similarly, feedback through operational amplifier 105 controls the reference current sourced at the drain of transistor MP4. But low-power operation for current bias circuit 100 requires that active resistor transistor MN3 be biased in the sub-threshold operating region, which leads to stability issues for the feedback control through operational amplifier 105. Operational amplifier 105 also requires considerable die space.

Accordingly, there is a need the art for low-power temperature-insensitive current bias circuits with improved stability and density.

SUMMARY

A current bias circuit is provided that includes a bias circuit configured to bias the gate of an active resistor transistor with a bias voltage to generate a current that is mirrored through a current mirror to produce an output current for the current bias circuit. To reduce the temperature sensitivity of the output current, the bias circuit generates the bias voltage so as to be greater than one-half of a power supply voltage for the current bias circuit and to have a negative temperature dependency.

These and other advantageous features may be better appreciated through the following detailed description.

BRIEF DESCRIPTION OF THE DRAWINGS

Implementations of the present disclosure and their advantages are best understood by referring to the detailed description that follows. It should be appreciated that like reference numerals are used to identify like elements illustrated in one or more of the figures.

DETAILED DESCRIPTION

A beta-multiplier-based current bias circuit is provided with improved stability, temperature-insensitivity, and low-power operation. In particular, the conventional need for a feedback loop to control the gate voltage of the active resistor transistor is eliminated. Instead, a bias circuit is provided that includes a stacked diode voltage divider that generates a bias voltage with a sufficient magnitude (greater than one-half the power supply voltage) and with a negative temperature dependency to ensure a suitable level of temperature insensitivity in the beta-multiplier-based current bias circuit.

Figure 1:
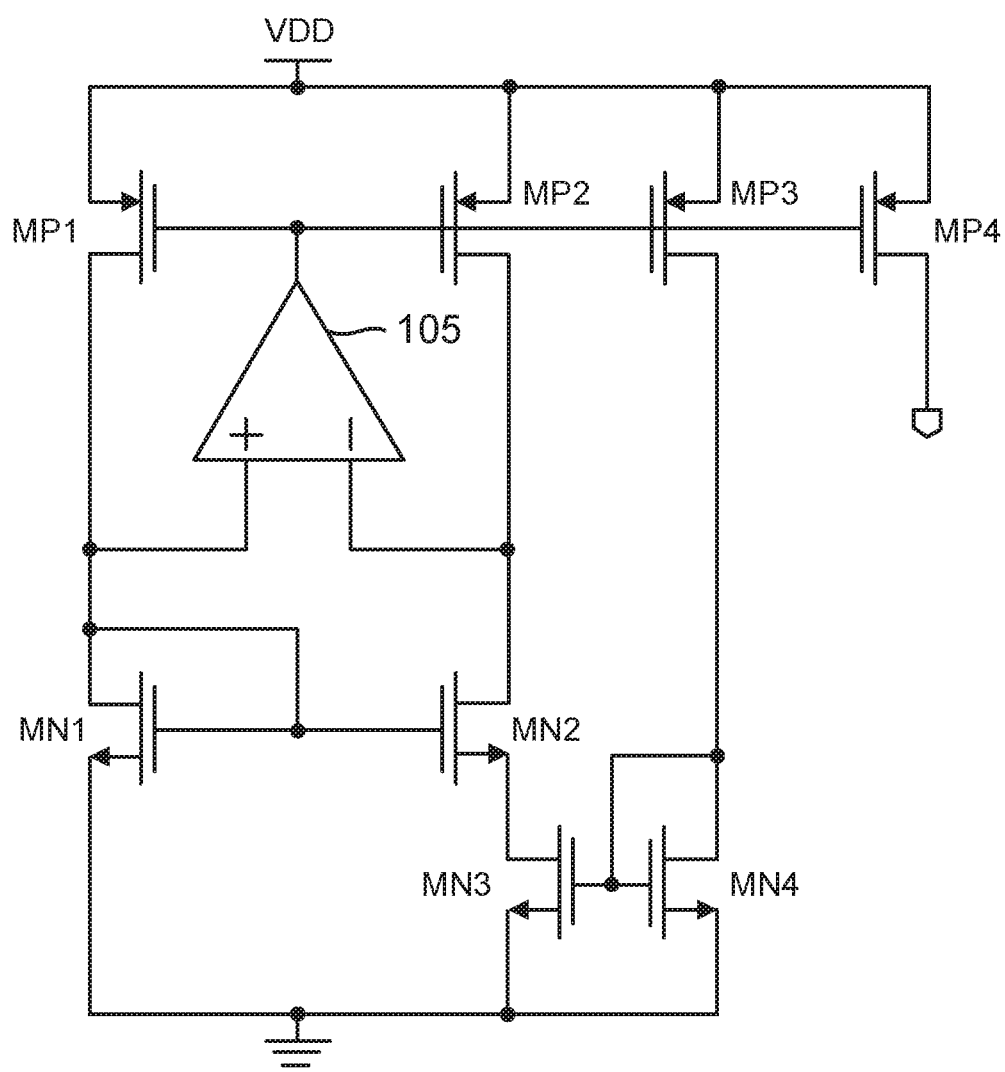
FIG. 1 is a circuit diagram of a conventional beta-multiplier-based bias current circuit.
Figure 2:
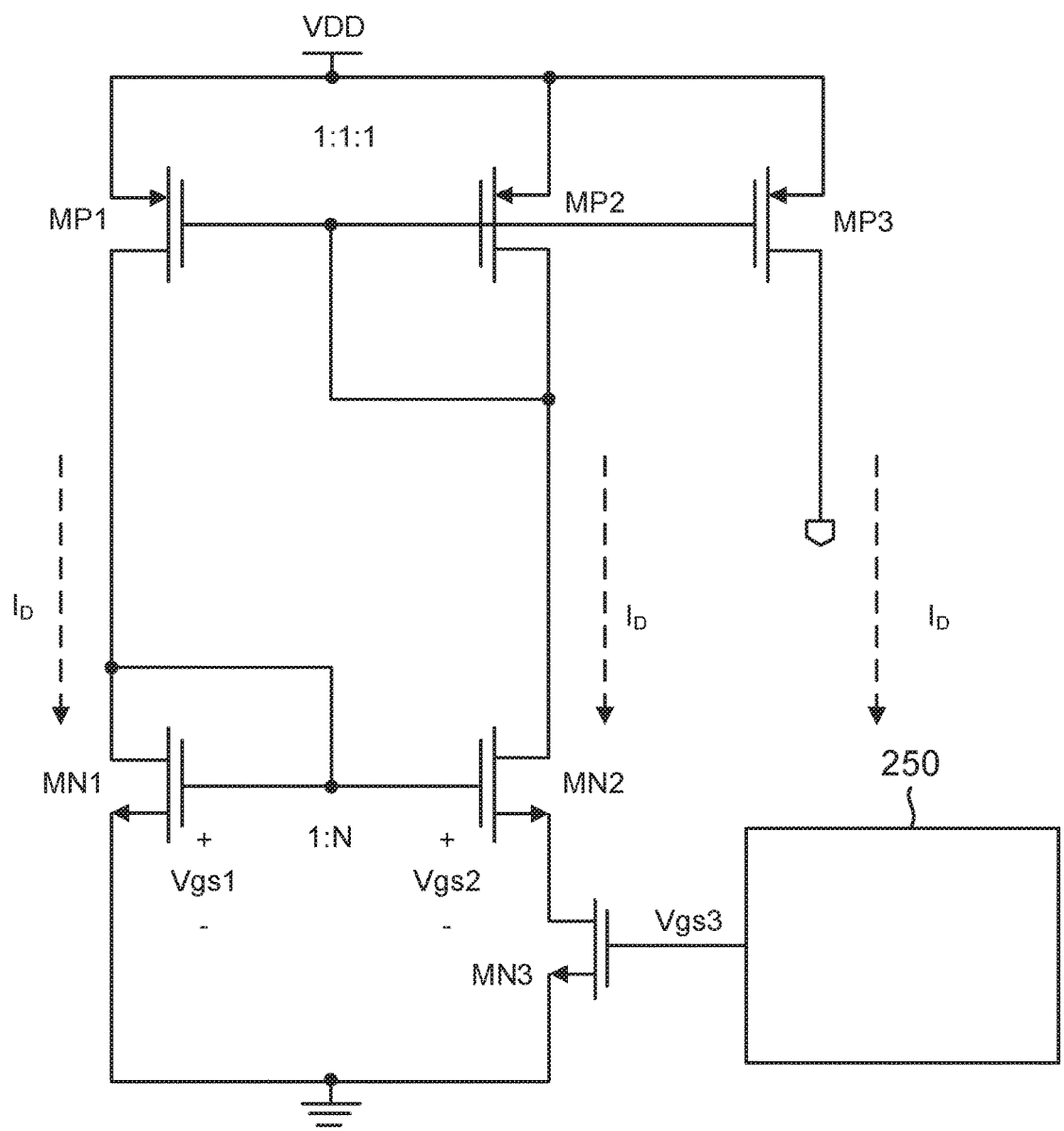
FIG. 2 is a circuit diagram of an improved beta-multiplier-based bias current circuit in accordance with an aspect of the disclosure.

An example beta-multiplier-based current bias circuit 200 is shown in FIG. 2. Active resistor transistor MN3 is coupled to the current mirror formed by transistors MN1 and MN2 as discussed with regard to FIG. 1. In particular, the source of active resistor transistor MN3 is tied to ground whereas its drain is tied to the source of transistor MN2. The gate of transistor MN2 is tied to the gate and drain of diode-connected transistor MN1, which has its source connected to ground. There is a 1:N size ratio between transistor MN1 and MN2, where N is a positive number. The drain of transistor MN1 is tied to the drain of a PMOS transistor MP1. But an operational amplifier does not control the gate of transistor MP1 or of a PMOS transistor MP2 as discussed with regard to FIG. 1. Instead, the gate of transistor MP1 is tied to the drain and gate of transistor MP2, which is now diode connected. The drain of diode-connected transistor MP2 is tied to the drain of transistor MN2. The sources for transistors MP1 and MP2 are tied to the power supply node. Transistor MP1 is matched to transistor MP2 so that a current $I_D$ passed by transistor MP2 is mirrored through transistor MP1. The magnitude of current $I_D$ is controlled by the resistance of active resistor transistor MN3 as controlled by a bias circuit 250. In particular, bias circuit 250 controls the gate voltage for active resistor transistor MN3. Since the source voltage is ground for active resistor transistor MN3, its gate voltage is its gate-to-source voltage $V_{gs3}$. Bias circuit 250 thus controls voltage $V_{gs3}$ (which may also be denoted as a bias voltage) to control the resistance of active resistor transistor MN3 so as to control the magnitude of current $I_D$. To deliver current $I_D$ as an output current to whatever circuit that needs such a reference current (e.g., a pulse generator as discussed previously), the gate of transistor MP2 is tied to the gate of transistor MP3, which is consistent with FIG. 1. However, the source of transistor MP3 is not driving any diode load to generate the voltage $V_{gs3}$ as discussed with regard to FIG. 1. Instead, the source of transistor MP3 delivers the current $I_D$ as an output current.

Some operating theory will now be discussed to disclose what is desirable in bias circuit 250 with regard to the generation of voltage $V_{gs3}$ such that the production of output current $I_D$ is temperature insensitive. This discussion will assume that diode-connected transistor MN1 and transistor MN2 are operating in the sub-threshold region. Those of ordinary skill in the art will appreciate that such a sub-threshold region operation depends upon the magnitude of current $I_D$ and the sizes of diode-connected transistor MN1 and transistor MN2. The following discussion assumes that these parameters are sized appropriately for sub-threshold operation of these transistors. An equation for such a sub-threshold levels of current $I_D$ through active resistor transistor MN3 is as follows:

$$I_D \approx \mu_n C_{ox}(W_3/L_3)(V_{gs3}-V_{th})V_T ln(N) \qquad \text{Eq. (1)}$$

assuming that voltage $V_{gs3}$ is relatively high and $1<N<2$, where $\mu_n$ is the charge carrier mobility, $C_{ox}$ is the gate oxide capacitance, $V_{th}$ is the threshold voltage, $W_3$ is the width, and $L_3$ is the length for active resistor transistor MN3. It can further be shown that the threshold voltage $V_{th}$ may be expressed as:

$$V_{th}=V_{th0}+\alpha_{vth}(T-T_0) \qquad \text{Eq. (2)}$$

where T is the temperature, $V_{th0}$ is the threshold voltage at a reference temperature $T_0$, and $\alpha_{vth}$ is the slope coefficient for the temperature dependency. Similarly, the voltage $V_{gs3}$ may be expressed as:

$$V_{gs3}=V_{gs30}+\alpha_{gs3}(T-T0) \qquad \text{Eq. (3)}$$

where $V_{gs30}$ is the gate-to-source voltage at the reference temperature T0 and $\alpha_{gs3}$ is the slope coefficient for the temperature dependency. Finally, the temperature dependence for the mobility $\mu_n$ may be expressed as:

$$\mu_n=\mu_0(T_0/T)^{\alpha\mu} \qquad \text{Eq. (4)}$$

where $\mu_0$ is the carrier mobility at the reference temperature $T_0$ and $\alpha_\mu$ is the temperature coefficient.

Equations (1) through (4) may be combined to show that the current $I_D$ can be approximated as:

$$I_D \approx \mu_0 T_0^{\alpha\mu} C_{ox}(W_3/L_3)(kn/q)ln(N)K_1(T+K_2/K_1T^2)/T^{\alpha\mu} \qquad \text{Eq. (5)}$$

where k is Boltzmann's constant, q is the charge of an electron, and n is the subthreshold slope factor of $1+Cd/C_{ox}$, where Cd is the depletion capacitance. $K_1$ and $K_2$ are variables expressed as:

$$K_1=V_{gs30}-V_{th0}-(\alpha_{gs3}-\alpha_{vth})T_0 \qquad \text{Eq. (6)}$$

and $$K_2 \text{ equals } (\alpha_{gs3}-\alpha_{vth}) \qquad \text{Eq. (7).}$$

Note that $\alpha_\mu$ is typically between 1 and 2 depending upon the semiconductor process and doping level.

The temperature dependency of equation (5) is the factor $(T+K_2/K_1T^2)/T^{\alpha\mu}$. The proper selection of the variables $K_1$ and $K_2$ will minimize or reduce this temperature dependency. In general, the selection of variables $K_1$ and $K_2$ depends upon the CMOS process. In an older CMOS process, the temperature coefficient $\alpha_\mu$ would be approximately equal 2and be larger than 1.5. In such a case, making the temperature dependency constant requires the ratio $K_2/K_1$ to be much larger than one. But in modern CMOS processes such as less than or equal to 20 nm, the doping concentration is increased so the temperature coefficient $\alpha_\mu$ is reduced (for instance, to less than 1.5). In such modern CMOS processes, it thus follows from equation (5) that if $K_1$ is relatively large compared to $K_2$ (or conversely, $K_2$ is relatively small compared to $K_1$), then the temperature dependency is minimized or reduced. From equation (6), it can be seen that if $K_1$ may be made relatively large by making the voltage $V_{gs3}$ relatively large such as at least greater than one-half the power supply voltage VDD.

With regard to reducing $K_2$, note that the slope coefficient for the temperature dependency $\alpha_{vth}$ in equation (7) is negative. $K_2$ may thus be made relatively small by making the temperature coefficient $\alpha_{gs3}$ have a proper negative value so that $K_2$ is relatively small but still has the correct polarity. Given such a negative value for the temperature coefficient $\alpha_{gs3}$, the bias voltage $V_{gs3}$ reduces as the temperature T rises. But the generation of these two properties (having the bias voltage $V_{gs3}$ relatively large while also having a negative temperature dependency for this voltage) is not readily apparent. For example, a resistor voltage divider may be readily used to divide the power supply voltage VDD to produce a relatively large bias voltage $V_{gs3}$. But the use of a resistor voltage divider requires a relatively large amount of die space. Moreover, the temperature dependency of the resulting divided voltage is flat instead of being negative.

Figure 3:
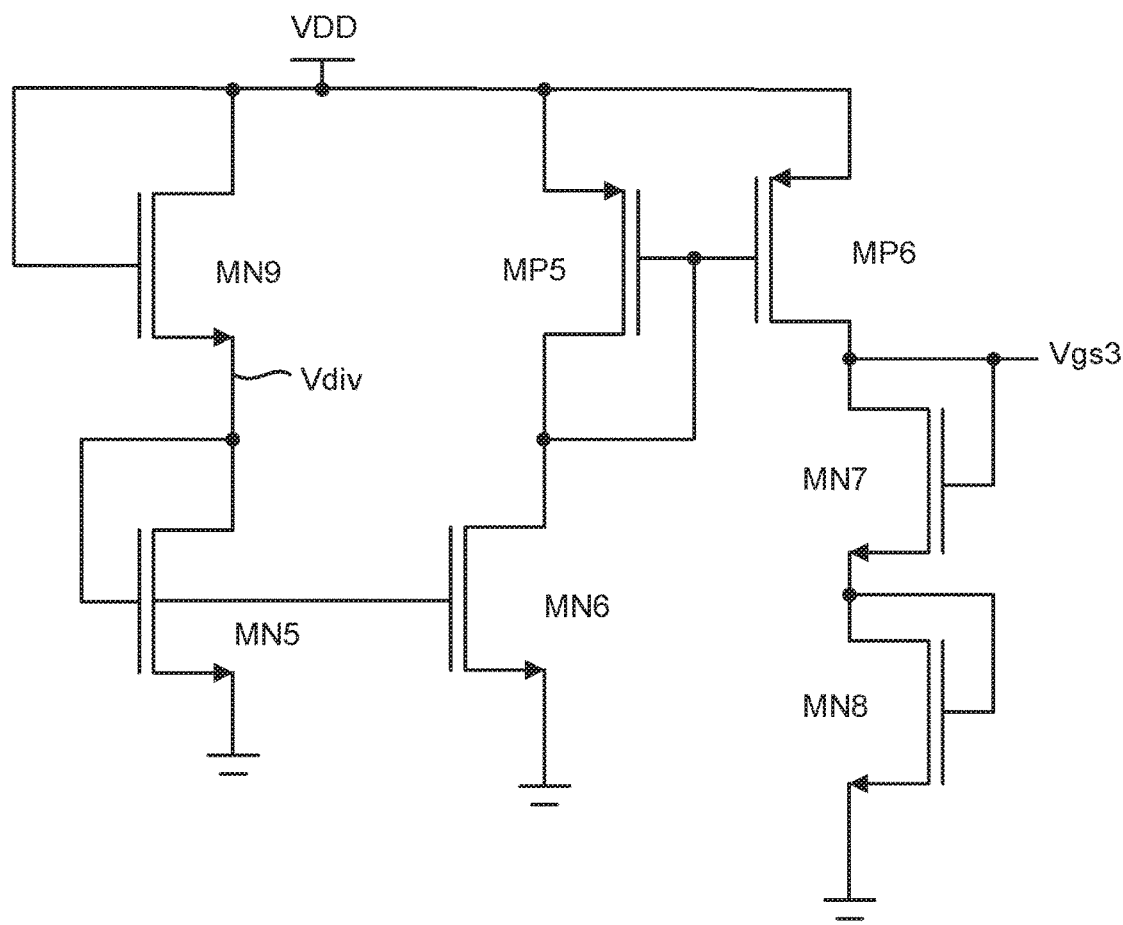
FIG. 3 is a circuit diagram of a bias circuit in the bias current circuit of FIG. 2 in accordance with an aspect of the disclosure.

In contrast to a resistor voltage divider, a stacked diode voltage divider does not require as much die space. But a stacked diode voltage divider having a voltage division ratio sufficient to produce a relatively large value (greater than one-half the power supply voltage VDD) for the bias voltage $V_{gs3}$ so that $K_1$ is relatively large results in a positive slope to the temperature dependency. The desired negative value to $K_2$ is then not achieved. In contrast, a stacked diode voltage divider having a voltage division ratio to produce a relatively small value (less than one-half of the power supply voltage VDD) for the bias voltage $V_{gs3}$ results in the desired negative temperature dependency so that $K_2$ is negative but then $K_1$ is too small. An example bias circuit 250 shown in FIG. 3 solves these problems yet still achieves a high density due to the use of a stacked diode voltage divider formed by a diode-connected NMOS transistor MN9 and a diode-connected NMOS transistor MN5. The drain of diode-connected transistor MN9 is tied to the power supply node for the power supply voltage VDD. The source of diode-connected transistor MN9 is connected to the drain (and gate) of diode-connected transistor MN5, which in turn has its source tied to ground.

The serial arrangement of diode-connected transistor MN9 and MN5 between the power supply node and ground produces a divided voltage (Vdiv) at the source of diode-connected transistor MN9. To ensure that the divided voltage has a negative temperature coefficient (which may also be denoted as a negative temperature dependency), diode-connected transistor MN5 is larger (has a greater width) than diode-connected transistor MN9. Diode-connected transistor MN5 is thus less resistive than diode-connected transistor MN9 such that the divided voltage is less than one-half of the power supply voltage VDD to ensure that the desired negative temperature dependency for the divided voltage.

Although the divided voltage thus provides the desired negative value for variable $K_2$, it would not produce the desired relatively large value for variable $K_1$ if it were used directly to bias the gate of active resistor transistor MN3 (discussed with regard to FIG. 2). The divided voltage thus drives the gate of a current source NMOS transistor MN6 to generate a current that is mirrored through a current mirror formed by a diode-connected PMOS transistor MP5 and a corresponding PMOS transistor MP6. In particular, the source of current source transistor MN6 is tied to ground whereas its drain is tied to the drain (and gate) of diode-connected transistor MP5. The sources for diode-connected transistor MP5 and transistor MP6 are tied to the power supply node. The gate of diode-connected transistor MP5 is tied to the gate of transistor MP6 so that the current conducted through diode-connected transistor MP5 (which is also the current conducted through transistor MN6) is mirrored through transistor MP6. The drain of transistor MP6 couples to ground through a diode load formed by series of a diode-connected NMOS transistor MN7 and a diode-connected transistor MN8. In particular, the drain (and gate) of diode-connected transistor MN7 is connected to the drain of transistor MP6 whereas its source is connected to the drain (and gate) of diode-connected transistor MN8. The source of diode-connected transistor MN8 is tied to ground. The bias voltage $V_{gs3}$ is produced at the drain of diode-connected transistor MN7. The resistive load produced by the serial stacking of diode-connected transistors MN7 and MN8 is sufficient that, in response to the mirrored current being driven through this diode load by transistor MP6, bias voltage $V_{gs3}$ is sufficiently large (greater than one-half of the power supply voltage VDD) such that the variable $K_1$ is also sufficiently large. Referring back to equation (5), the temperature dependency for the current $I_D$ conducted by active resistor transistor MN3 is thus reduced or minimized as desired. This temperature insensitivity is achieved without the stability challenges discussed with regard to FIG. 1 and with considerably greater density as well. In one implementation, bias circuit 250 may be deemed to form a means for biasing active resistor transistor MN3 with a bias voltage ($V_{gs3}$) to control a resistance for the active resistor transistor so as to control a current through the active resistor transistor, wherein the bias voltage is greater than one-half of a power supply voltage (VDD) for the current bias circuit and has a negative temperature dependency.

Figure 4:
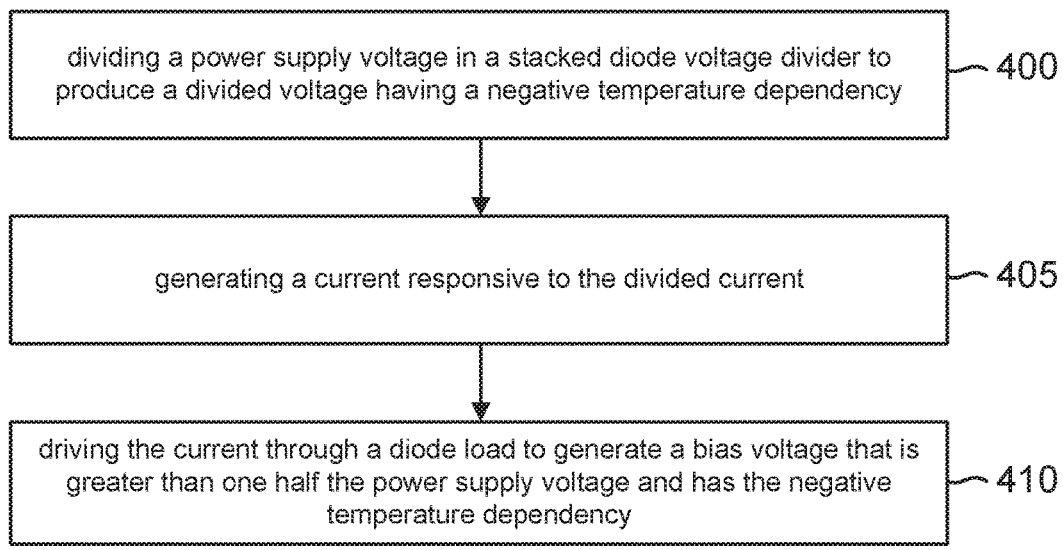
FIG. 4 is flowchart for a method of operation for generating the bias voltage for an improved beta-multiplier-based bias current circuit in accordance with an aspect of the disclosure.

A method of operation for generating the bias voltage $V_{gs3}$ will now be discussed with regard to the flowchart of FIG. 4. The method includes an act 400 of dividing a power supply voltage in a stacked diode voltage divider to produce a divided voltage having a negative temperature dependency. The dividing of the power supply voltage VDD to produce the divided voltage Vdiv is an example of act 400. The method also includes an act 405 of generating a current responsive to the divided voltage. The current generated by transistor MP6 in response to the divided voltage Vdiv is an example of act 405. Finally, the method includes an act 410 of driving the current through a diode load to generate a bias voltage that is greater than one half the power supply voltage and has the negative temperature dependency. The production of the bias voltage $V_{gs3}$ across the diode load formed by diode-connected transistors MN7 and MN8 is an example of act 410.

Those of ordinary skill will appreciate that numerous modifications may be made to the improved beta-multiplier-based bias circuit 200 discussed herein. For example, the fidelity of the current mirrors may be increased through the use of cascode transistors as known in the current mirror arts. The diode load used to develop the voltage $V_{gs3}$ in bias circuit 250 may comprise just one diode-connected transistor in alternate configurations. Diode-connected transistors MN9 and MN5 may each be replaced by a series of diode-connected transistors. In such implementations, the source of transistor MN9 need not be tied to ground but may be tied to node between a pair of the diode-connected transistors replacing diode-connected transistor MN5. It will thus be appreciated that many modifications, substitutions and variations can be made in and to the materials, apparatus, configurations and methods of use of the devices of the present disclosure without departing from the scope thereof. In light of this, the scope of the present disclosure should not be limited to that of the particular implementations illustrated and described herein, as they are merely by way of some examples thereof, but rather, should be fully commensurate with that of the claims appended hereafter and their functional equivalents.

We claim:

1. A current bias circuit, comprising:
an active resistor transistor;
a bias circuit configured to drive a gate of the active resistor transistor with a bias voltage to control a resistance for the active resistor transistor so as to control a current through the active resistor transistor, wherein the bias voltage is greater than one-half of a power supply voltage for the current bias circuit and has a negative temperature dependency, wherein the bias circuit comprises a stacked diode voltage divider configured to divide the power supply voltage into a divided voltage having the negative temperature dependency; and
a current mirror configured to mirror the current through the active resistor transistor to generate a gate voltage for an output transistor so as to conduct an output current for the current bias circuit through the output transistor.

2. The current bias circuit of claim 1, wherein the current mirror comprises a p-type metal-oxide semiconductor (PMOS) current mirror, and wherein the output transistor is a PMOS output transistor.

3. The current bias circuit of claim 1, wherein the active resistor transistor is an n-type metal-oxide semiconductor (NMOS) active resistor transistor having a drain connected to a drain of a diode-connected PMOS transistor in the current mirror.

4. The current bias circuit of claim 1, wherein the current mirror is a cascode current mirror.

5. The current bias circuit of claim 1, where the current mirror comprises a first current mirror and a second current mirror.

6. The current bias circuit of claim 5, wherein the first current mirror is an NMOS current mirror and the second current mirror is a PMOS current mirror.

7. The current bias circuit of claim 1, wherein the bias circuit further comprises a current source transistor configured to conduct a current responsive to the divided voltage.

8. The current bias circuit of claim 7, wherein the bias circuit further comprises:
 a diode load; and
 a bias circuit current mirror configured to mirror the current responsive to the divided voltage into the diode load to produce the bias voltage across the diode load.

9. The current bias circuit of claim 1, wherein the current bias circuit is incorporated into a pulse generator configured to generate a pulse responsive to the output current.

10. A method, comprising:
 dividing a power supply voltage in a stacked diode voltage divider to produce a divided voltage having a negative temperature dependency;
 generating a first current responsive to the divided voltage; and
 driving the first current through a diode load to generate a bias voltage that is greater than one half the power supply voltage and has the negative temperature dependency.

11. The method of claim 10, wherein driving the first current through the diode load comprise driving the current through a plurality of diodes connected in series.

12. The method of claim 10, wherein dividing the power supply voltage in the stacked diode voltage divider comprises dividing the power supply voltage by more than two.

13. The method of claim 10, wherein generating the first current comprises:
 driving a gate of a current source transistor with the divided voltage to produce a second current; and
 mirroring the second current through a current mirror to generate the first current.

14. The method of claim 10, further comprising:
 biasing a gate of an active resistor transistor with the bias voltage to control a resistance for the active resistor transistor so as to control a second current through the active resistor transistor.

15. The method of claim 14, further comprising:
 mirroring the second current through a current mirror to produce a gate voltage for an output transistor; and
 sourcing an output current through the output transistor responsive to its gate voltage.

16. The method of claim 15, further comprising:
 generating a pulse responsive to the output current.

* * * * *